United States Patent
Neugart et al.

(10) Patent No.: US 9,831,048 B2
(45) Date of Patent: Nov. 28, 2017

(54) SWITCHING-OPERATION ARRANGEMENT HAVING A MOVABLE ACTIVATING SURFACE

(71) Applicant: Marquardt GmbH, Rietheim-Weilheim (DE)

(72) Inventors: Elmar Neugart, VS-Villingen (DE); Frank Rottler, Königsfeld-Neuhausen (DE)

(73) Assignee: Marquardt GmbH, Rietheim-Weilheim (DE)

( * ) Notice: Subject to any disclaimer, the term of this patent is extended or adjusted under 35 U.S.C. 154(b) by 0 days.

(21) Appl. No.: 15/044,418

(22) Filed: Feb. 16, 2016

(65) Prior Publication Data

US 2016/0247640 A1    Aug. 25, 2016

(30) Foreign Application Priority Data

Feb. 17, 2015  (DE) ......................... 10 2015 001 836
Feb. 17, 2015  (DE) ......................... 10 2015 001 838
Feb. 17, 2015  (DE) ......................... 10 2015 001 839

(51) Int. Cl.
*H01H 3/12* (2006.01)
*H01H 13/14* (2006.01)
(Continued)

(52) U.S. Cl.
CPC ............ *H01H 3/122* (2013.01); *H01H 13/14* (2013.01); *G05G 1/02* (2013.01); *H01H 13/48* (2013.01)

(58) Field of Classification Search
CPC .... H01H 3/122; H01H 13/14; H01H 2235/01; H01H 23/12; H01H 13/52
(Continued)

(56) References Cited

U.S. PATENT DOCUMENTS

| 5,555,004 | A  | * | 9/1996 | Ono ..................... | G06F 3/0338 200/6 A |
| 7,579,560 | B2 | * | 8/2009 | Choi .................. | H01H 13/7065 200/5 A |
| 8,957,333 | B2 | * | 2/2015 | Chou .................. | H01H 13/705 200/5 A |

FOREIGN PATENT DOCUMENTS

DE       82 14 479.6       9/1982
DE       38 37 636 A1      5/1990
(Continued)

OTHER PUBLICATIONS

German Search Report (Application No. 10 2015 001 836.1) dated Nov. 12, 2015.
(Continued)

*Primary Examiner* — Edwin A. Leon
(74) *Attorney, Agent, or Firm* — Burr & Brown, PLLC

(57) ABSTRACT

The invention relates to a switching-operation arrangement for a motor vehicle, having a movable actuating surface. The actuating surface has an extent along a first axis and a second axis, which are located perpendicularly to one another. The actuating surface interacts with a displacement means such that the actuating surface can be moved linearly, in the direction of a third axis (z), by at least one distance from a starting position into an actuating position, the third axis (z) being located perpendicularly to the first and second axes. The actuating position is in the form of a switching position and acts with switching action on a switching element or a sensor. The displacement means includes a guide means for guiding the actuating surface along the first axis and at least one braced-in elastic element for guiding the actuating surface along the second axis.

16 Claims, 17 Drawing Sheets

(51) Int. Cl.
*G05G 1/02* (2006.01)
*H01H 13/48* (2006.01)

(58) Field of Classification Search
USPC .................. 200/339, 5 A, 245, 292, 295, 338
See application file for complete search history.

(56) References Cited

FOREIGN PATENT DOCUMENTS

| | | |
|---|---|---|
| DE | 20 2004 020 735 U1 | 5/2006 |
| DE | 20 2013 101 341 U1 | 7/2013 |
| DE | 10 2013 203 568 A1 | 7/2014 |
| DE | 10 2014 007 988 A1 | 12/2014 |

OTHER PUBLICATIONS

German Search Report (Application No. 10 2015 001 838.8) dated Nov. 13, 2015.
German Search Report (Application No. 10 2015 001 839.6) dated Nov. 12, 2015.

* cited by examiner

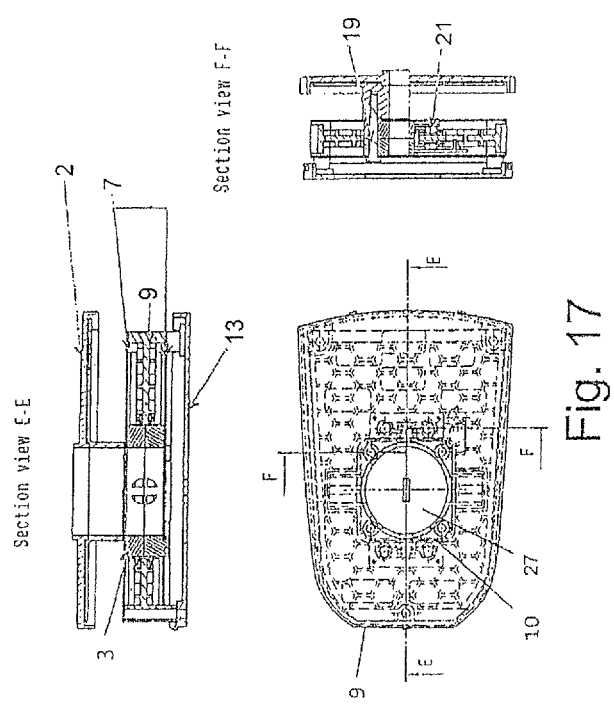

SWITCHING-OPERATION ARRANGEMENT HAVING A MOVABLE ACTIVATING SURFACE

BACKGROUND OF THE INVENTION

1. Field of the Invention

The invention relates to a switching-operation arrangement having a movable activating surface that moves linearly and acts with a switching action on a switching element or a sensor.

2. Description of Related Art

Such a switching-operation arrangement may be configured, for example, in the form of a touch pad for operating various functions and/or in the manner of a short-stroke button. The switching-operation arrangement can be used, in particular, in a motor vehicle.

Such a switching-operation arrangement has a manually movable actuating surface for operation by the user. The actuating surface, which has an extent along a first axis and a second axis, which are located approximately perpendicularly to one another, interacts with a displacement means such that the actuating surface can be moved essentially linearly, in the direction of a third axis, by at least one distance from a starting position or a zero position into an actuating position, wherein the third axis is located essentially perpendicularly to the first and second axes. The actuating position may be in the form of a switching position such that the actuating surface, in the switching position, acts with switching action on a switching element, a sensor or the like. This then generates a switching signal, which, in turn, can be used for triggering a correspondingly associated function. It has been found that tilting of the actuating surface, in particular in the event of the latter being operated eccentrically by the user, can occur.

SUMMARY OF THE INVENTION

It is an object of the invention to develop the switching-operation arrangement further such that tilting of the actuating surface when the latter is operated by the user is largely avoided.

In the case of the switching-operation arrangement according to the invention, the displacement means comprises a guide means for guiding the actuating surface along and/or on the first axis (x axis). The displacement means also comprises at least one braced-in elastic element for guiding the actuating surface along and/or on the second axis (y axis). This advantageously achieves parallel guidance of the actuating surface when the latter is moved, and therefore tilting of the actuating surface is largely avoided. The parallel guidance of the actuating surface is provided in particular even when the extent of the actuating surface along the first axis (x axis) is significantly different from that along the second axis (y axis), that is to say when the extent of the actuating surface along the first axis (x) is smaller or greater than that along the second axis (y).

The switching-operation arrangement according to the invention is suitable particularly for operation using a short stroke. For this purpose, it is possible for the length and/or the width of the actuating surface along at least one of the first two axes (x and/or y) to be greater than the distance over which guidance is effected by the displacement means to provide for the movement capability of the operating surface in the direction of the third axis (z). It is advantageously possible here for the movement capability of the actuating surface in the direction of the third axis (z) to be free of tilting in relation to the first two axes (x and/or y).

The elastic element may expediently be configured in the form of a sheet-like element of small thickness in the manner of a membrane, such that the elastic element can be deflected elastically essentially perpendicularly to the surface of the membrane. To be precise, it may be recommended of the thickness of the elastic element to be small in relation to the sheet-like extent thereof.

In a straightforward configuration, the displacement means may comprise an actuator. The actuator can interact with a frame and/or a spacer. It is also possible for the elastic element to be braced in on the frame and/or on the spacer. The frame may be connected to the spacer by means of the membrane, to be precise, in particular, by means of two essentially parallel membranes. It is expediently possible for the two membranes to be arranged on mutually opposite sides of the frame and/or of the spacer.

In a functionally reliable manner, the spacer may be fastened on the actuator, for example by means of a screw connection. It is expediently possible for the actuating surface to be arranged on the actuator. In a straightforward configuration, the actuating surface may be mounted on the actuator in the manner of a cap.

In a functionally reliable configuration, the guide means may comprise a guide rib and a groove, which interacts with the guide rib. It is possible for the one constituent part of the guide means to be provided on the actuator and for the other constituent part of the guide means to be provided on the frame.

In a cost-effective manner, the elastic element may comprise a stiff plastic sheet and/or a thin plastic plate. The elastic element can be fastened in a braced-in state on the frame and/or on the spacer. The fastening can be effected straightforwardly by means of welding, adhesive bonding, riveting, screw connection, heat staking/hot stamping, clamping or the like.

The switching element, the sensor or the like can generate a signal on account of the switching action of the actuating surface in the switching position. This signal can then serve, in turn, for switching and/or triggering an associated function in the manner of a switching signal. For example, the switching-operation arrangement can then be used in the form of an operating panel with short-stroke buttons in the motor vehicle.

Finally, a housing may be provided, in a customary manner, so that the switching-operation arrangement is protected against the influence of harmful substances. The actuating surface may be arranged on one side of the housing. The actuating surface may then be arranged, in turn, such that it can be moved in the direction of the housing.

For a particularly preferred configuration of the switching-operation arrangement according to the invention, the following should be noted.

A short-stroke button, to be precise one with large dimensions, is created. In order to realize a short-stroke button, for example with a stroke of approximately 0.4 mm, having external dimensioning which is greater than a guidance length available, it is necessary to have a corresponding guide system, in order to ensure parallel lowering with, for example, a delta of not more than +/−0.1 mm for the button of the position at which the button is actuated.

The button, configured for example in the manner of a design cap, is mounted on an actuator, which is guided in accordance with requirements. Button guidance using a guide rib and groove on the corresponding actuator, or on the housing, is provided here around the "short" side of the button, for example around the X axis. In order to avoid rotation around the other axis, for example around the Y axis, a system having two plastic springs, a spacer with a housing and an actuator is provided.

The spring elements are welded on the housing and on the spacer. Instead of welding, the fastening may also be effected by means of adhesive bonding. The rigid connection in relation to the movable actuator is ensured via a screw connection of two or more screws through the aforementioned components into the actuator. It is ensured that the actuator does not rotate, or at most rotates only to a very slight extent, in that the torque is divided up into tensile-stressing forces in the spring elements.

The advantages achieved by the invention consist, in particular, in the following:
  Large buttons, upon actuation at any desired point, lower in a parallel state without skewing and/or tilting.
  In relation to a solution using a clip or bracket, the solution according to the invention provides a higher level of precision for the parallel lowering of the button.
  The solution according to the invention is suitable for smaller switching strokes such as, for example, of approximately 0.4 mm.
  The guidance for the button is largely free of play.

BRIEF DESCRIPTION OF THE DRAWINGS

Exemplary embodiments of the invention with various developments and configurations will be described in more detail hereinbelow and are illustrated in the drawings, in which:
FIG. 17 shows various sections through the switching-operation arrangement from FIG. 14.

DETAILED DESCRIPTION OF THE INVENTION

Figure 1:
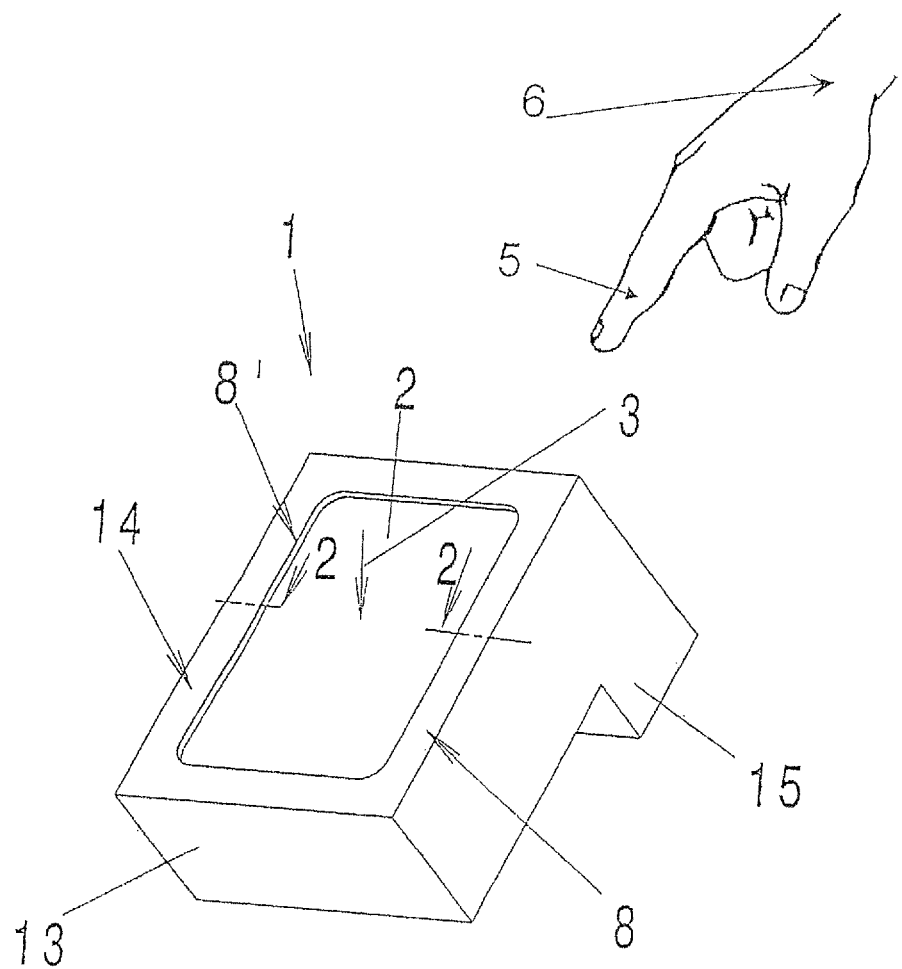
FIG. 1 shows a perspective view of a switching-operation arrangement.

FIG. 1 shows a switching-operation arrangement 1 in the manner of a touch pad, which is used in particular for a motor vehicle. The switching-operation arrangement 1 has a housing 13, which consists of plastic and on the one manually accessible surface 14 of which is located an actuating surface 2, or operating surface 2, extending in the x and y directions. The user can operate the switching-operation arrangement 1 as intended by manual action by means of an element 5 on the actuating surface 2. The element 5 may be the finger 5 of a human hand 6, the intended operation being made possible by means of corresponding movement of the finger 5. It is possible for example for the switching-operation arrangement 1 to be arranged in the center console of the motor vehicle and to be provided for operating a navigation system, a screen or the like in the motor vehicle. The switching-operation arrangement 1 can be connected by means of a plug connection 15 for example to a bus system in the motor vehicle.

The switching-operation arrangement 1 is provided with a sensor (not shown specifically), which interacts with the actuating surface 2. The sensor, for example, a capacitive sensor and/or an infrared-radiation sensor generates a signal when the element 5, in this case for example the finger 5 of the user's hand 6, approaches the actuating surface 2, and/or when the element 5 comes into contact with the actuating surface 2 and/or when the actuating surface 2 is subjected to the action of pressure by means of the element 5. The signal then serves for switching and/or triggering and/or selecting a function in the motor vehicle in the manner of a switching signal.

Figure 2:
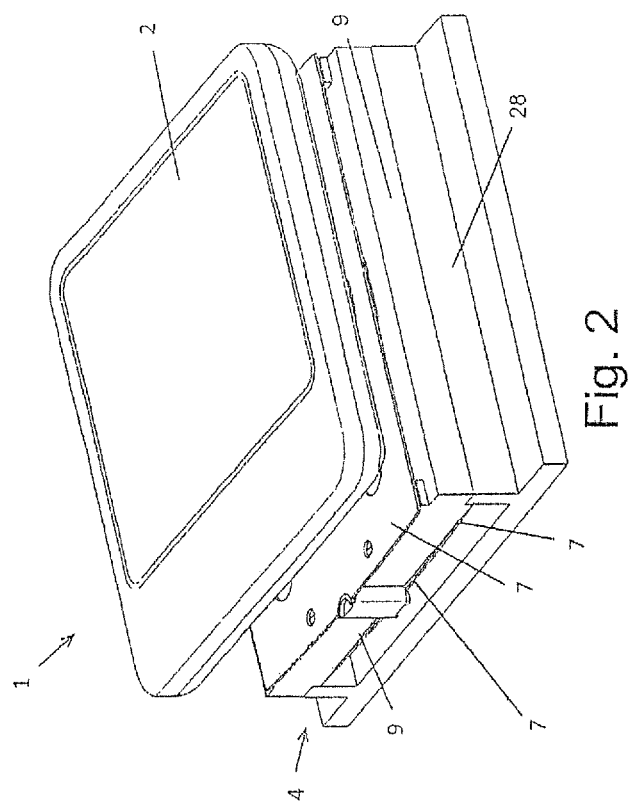
FIG. 2 shows the switching-operation arrangement from FIG. 1, wherein the housing has been removed.

Furthermore, the actuating surface 2 of the switching-operation arrangement 1 is configured such that it can be moved in direction 3 (z direction), and therefore the actuating surface 2 can be moved manually by means of the finger 5 in direction 3, and thus in the direction of the interior of the housing 13. For this purpose, the actuating surface 2 is configured with a slight gap 8' in relation to the peripheral region 8 running all the way around the housing 13. As can also be seen in FIG. 2, for this purpose, the actuating surface 2 interacts with a displacement means 4 such that the actuating surface 2 can be moved essentially linearly by at least one distance from a starting or zero position into an actuating position. The actuating position is in the form of a switching position such that the actuating surface 2, in the switching position, acts with switching action on an electrical switching element (not shown specifically). The switching element here generates a switching signal which can serve, for example, as an "enter" command and thus for switching and/or triggering the associated function in the motor vehicle. Instead of an electrical switching element, is also possible to use a sensor, such as a Hall sensor, an inductive sensor, a light barrier or the like.

Figure 4:
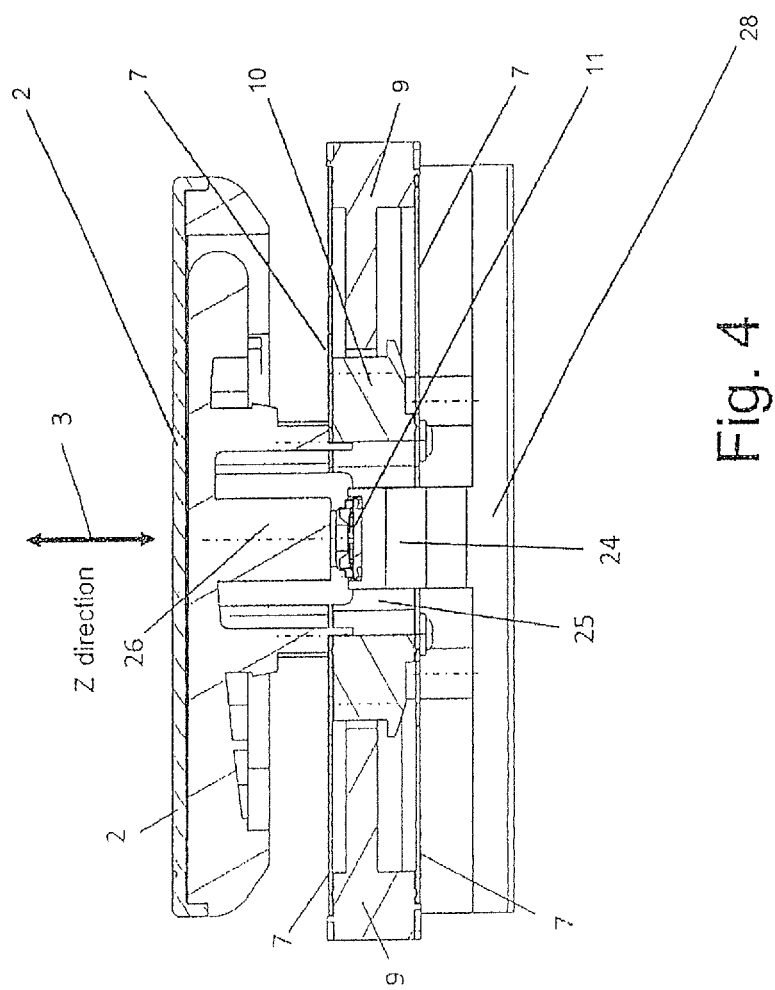
FIG. 4 shows a section taken along line 2-2 in FIG. 1.
Figure 5:
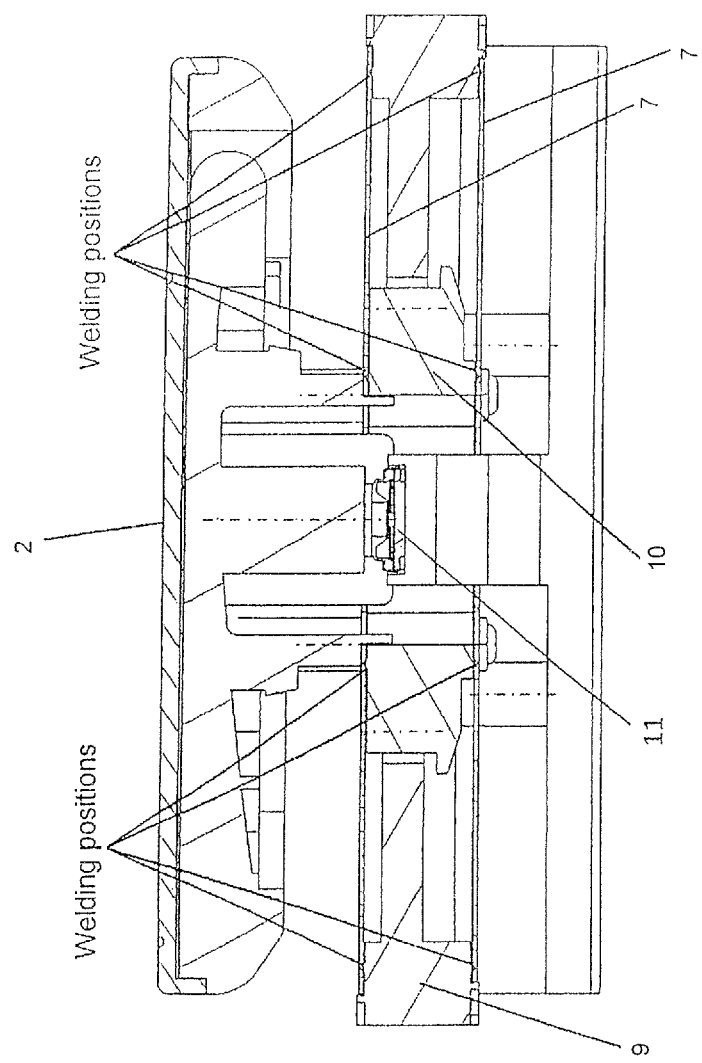
FIG. 5 shows a section as in FIG. 4, wherein the fastening positions for the membrane are illustrated in more detail.

The displacement means 4 has at least one braced-in elastic element 7. As can be gathered in more detail from FIG. 3, the elastic element 7 is configured in the form of a sheet-like element of small thickness in the manner of a membrane, such that the elastic element 7 can be deflected elastically essentially perpendicularly to the surface of the membrane, that is to say in the z direction 3. In particular, small thickness is to be understood to mean that the thickness of the elastic element 7 is small in relation to sheet-like extent thereof. The actuating surface 2 interacts with a frame 9 and/or a spacer 10. In the present case, the frame 9 is connected to the spacer 10 by means of the elastic element 7, to be precise by means of two essentially parallel elastic elements 7, which are arranged on mutually opposite sides of the frame 9 and/or of the spacer 10. The elastic element 7 here is braced in on the frame 9 and/or on the spacer 10, as can be seen in FIG. 4. For this purpose, the elastic element 7 has its periphery fastened on the frame 9 and/or on the spacer 10 by welding, wherein the welding positions are illustrated in more detail in FIG. 5 or in FIG. 6. The welding can be carried out by means of ultrasonic welding, friction welding, laser welding or the like. Instead of welding, the elastic element 7 can also be fastened by riveting, screw connection, adhesive bonding, heat staking/hot stamping, clamping or the like.

Figure 3:
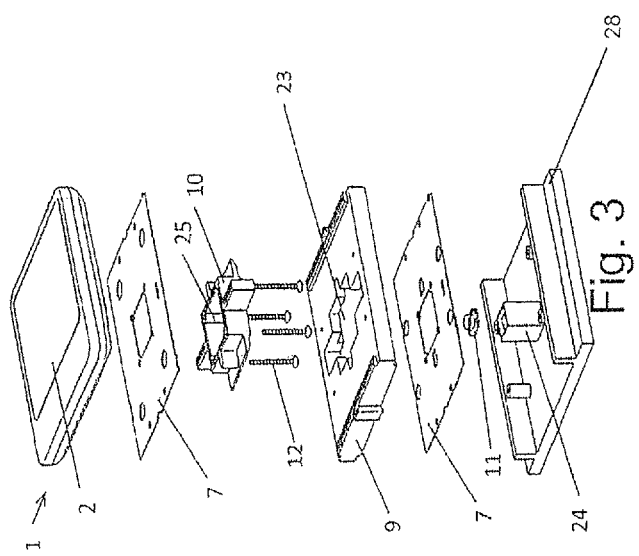
FIG. 3 shows an exploded illustration of the switching-operation arrangement from FIG. 2.
Figure 7:
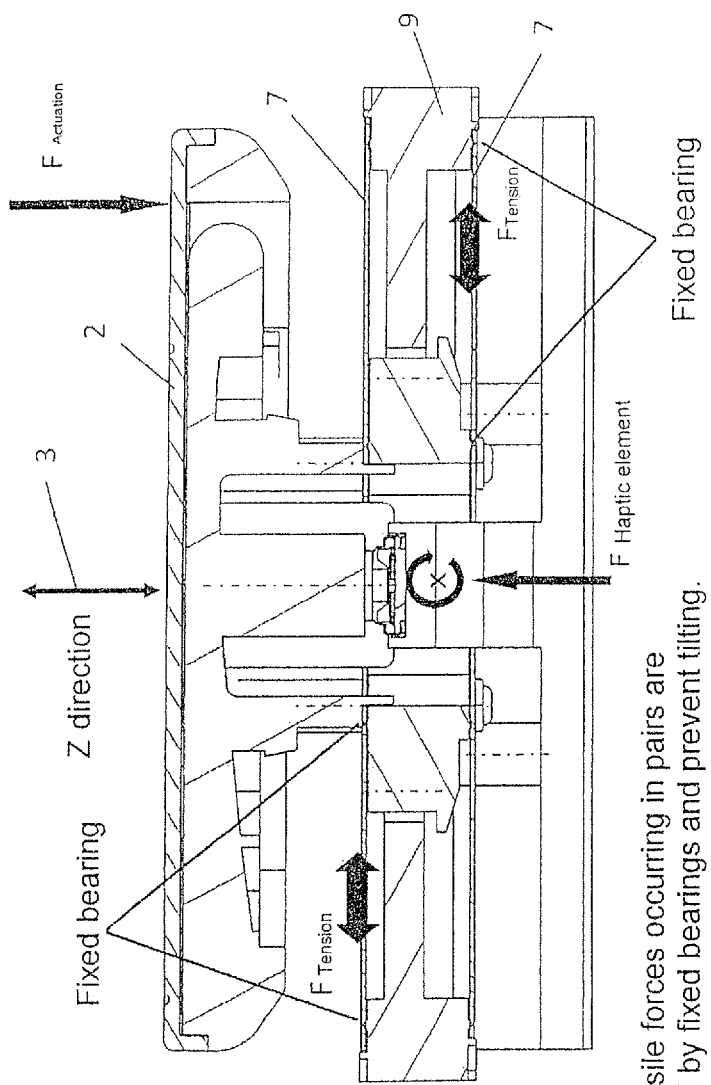
FIG. 7 shows a section as in FIG. 5, wherein the absorption of the forces upon actuation is illustrated in more detail.

According to FIG. 3, the elastic element 7 comprises a stiff plastic sheet and/or a thin plastic plate. The plastic sheet and/or the plastic plate is dimensioned with such a level of stiffness that, when not subjected to loading, it undergoes essentially no deformation. Elastic deflection of the plastic sheet and/or the plastic plate takes place only in the case of appropriate movement of the actuating surface 2 on account of being operated by the user. When the elastic element 7 is deflected elastically, tensile forces occurring in pairs are absorbed, as is illustrated in more detail in FIG. 7, and prevent tilting of the actuating surface 2.

The plastic for the plastic sheet and/or for the plastic plate may be polycarbonate, polyamide or the like. The frame 9 and/or the spacer 10 may likewise consist of plastic, for example polycarbonate, polyamide or the like. The frame 9 and/or the spacer 10 are/is expediently produced by means of injection molding.

Figure 6:
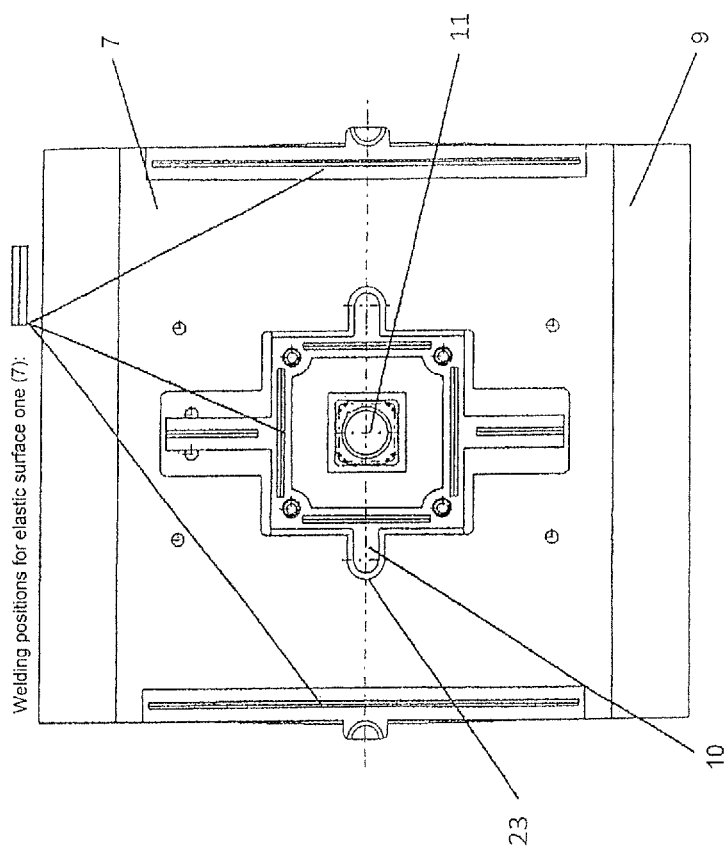
FIG. 6 shows a plan view of the arrangement from FIG. 5.

The frame 9 is arranged in a non-movable manner in the housing 13, as can be gathered from FIG. 4. The spacer 10, according to FIG. 6, is arranged in a movable manner in a mount 23 in the frame 9 in the manner of a guide. In the present case, the mount 23 is of approximately cross-shaped configuration, and the spacer 10 is configured in a manner corresponding to the mount 23. The actuating surface 2 is fastened on the spacer 10 by means of screws 12, as can be seen in FIG. 3. Instead of the actuating surface 2 being fastened on the spacer 10, it is, of course, also possible, in a kind of reversal of effect, for the actuating surface 2 to be fastened on the frame 9 and for the spacer 10 to be arranged in a non-movable manner in the housing 13, but this is not shown specifically.

It is also possible for an active and/or a passive element 11, the latter being shown in FIG. 3, to interact with the actuating surface 2 in order to restore the actuating surface 2 into the starting position and/or to produce a haptic means for moving the actuating surface 2 into the actuating position. It is possible for the passive element 11 to include a compression spring, a switch, a haptic mat or the like and for the active element 11 to include a piezo element, a lifting magnet or the like. The passive and/or active element 11 is arranged on an attachment 24 located in the housing 13, to be precise on a base plate 28 of the housing 13. As can also be seen in FIG. 4, the attachment 24 projects into an aperture 25 in the spacer 10. It is also the case that a protuberance 26, which is directed toward the attachment 24, is arranged on the actuating surface 2. The actuating surface 2 then interacts, upon being moved by means of the protuberance 26, with the active and/or passive element 11. Of course, it is also possible for the active and/or passive element 11 to interact directly with the spacer 10, but this is not shown specifically.

To sum up, it may thus be said that the actuating surface 2 of the switching-operation arrangement 1 has a sheet-like configuration with a length in a first direction (for example the x axis) and with a width in a second direction (for example the y axis). The actuating surface 2 can be moved linearly by a distance, by means of the displacement means 4, in a third direction (for example the z axis), which is located essentially perpendicularly to the first two directions (x and/or y axis). The length and/or width of the actuating surface 2 in at least one of the first two directions (x and/or y axis) here are/is greater than the distance over which guidance is effected by the displacement means 4 to provide for the movement capability of the actuating surface 2 in the third direction (z axis). On account of the above-described configuration of the displacement means 4, the movement capability of the actuating surface 2 in the third direction (z axis) is free of tilting in relation to the first two directions (x and/or y axis).

Figure 8:
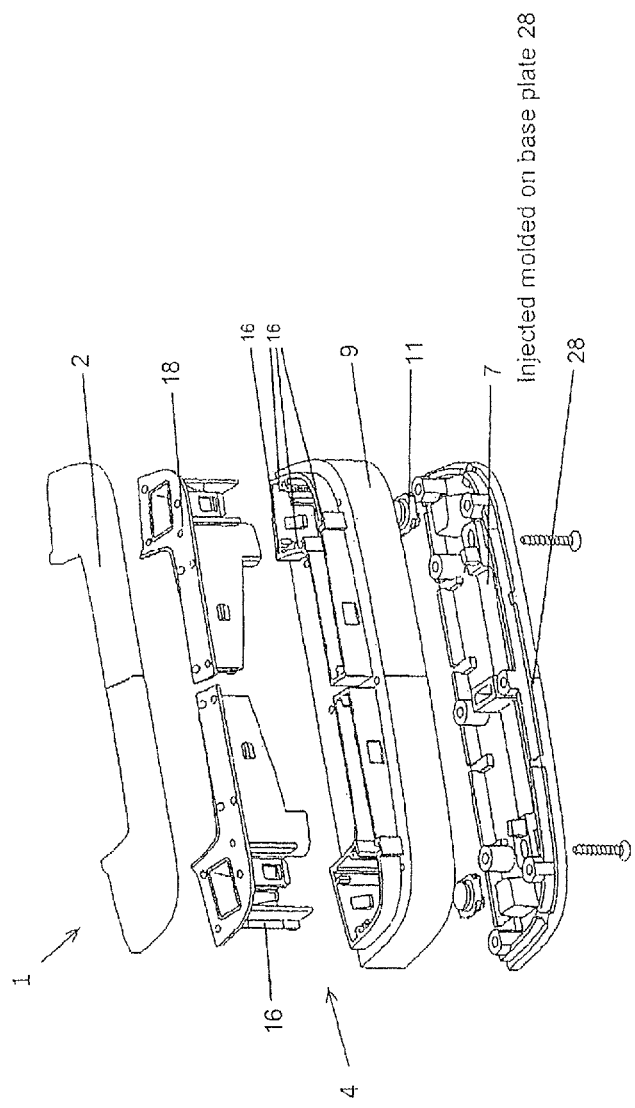
FIG. 8 shows an exploded illustration of a further switching-operation arrangement.
Figure 9:
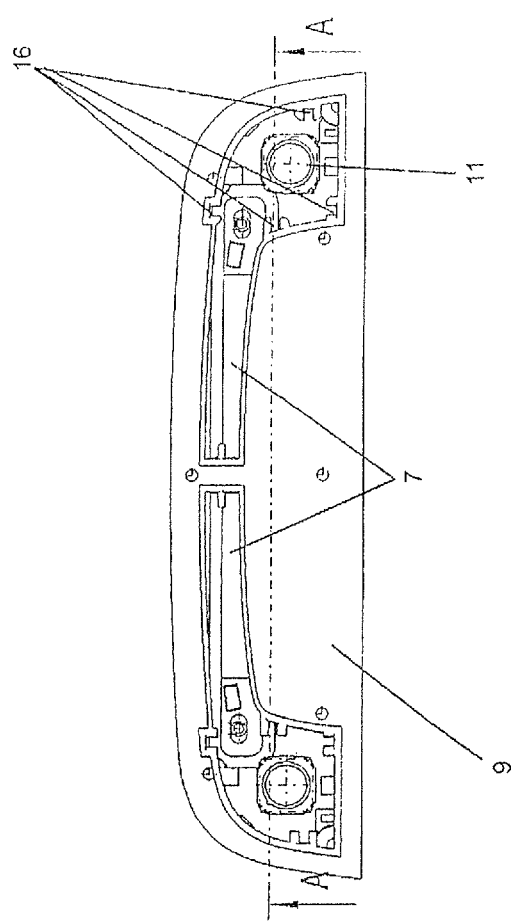
FIG. 9 shows the plan view of the arrangement according to FIG. 8.
Figure 10:
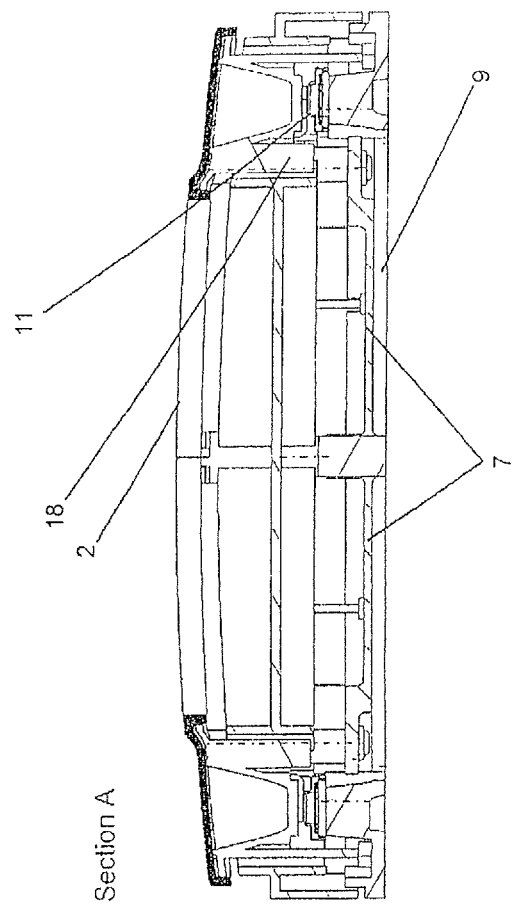
FIG. 10 shows a section through the arrangement according to FIG. 8.

FIGS. 8 to 10 show a further exemplary embodiment for a switching-operation arrangement 1. This switching-operation arrangement 1 has, once again, an elastic element 7 configured in the form of a sheet-like element of small thickness in the manner of a membrane. In addition, the displacement means 4 comprises a groove-and-tongue guide 16 for guiding the actuating surface 2 precisely upon actuation of the same. The actuating surface 2 acts on a two-part actuator 18, and this makes it possible to generate two switching signals for the respective actuation.

Figure 11:
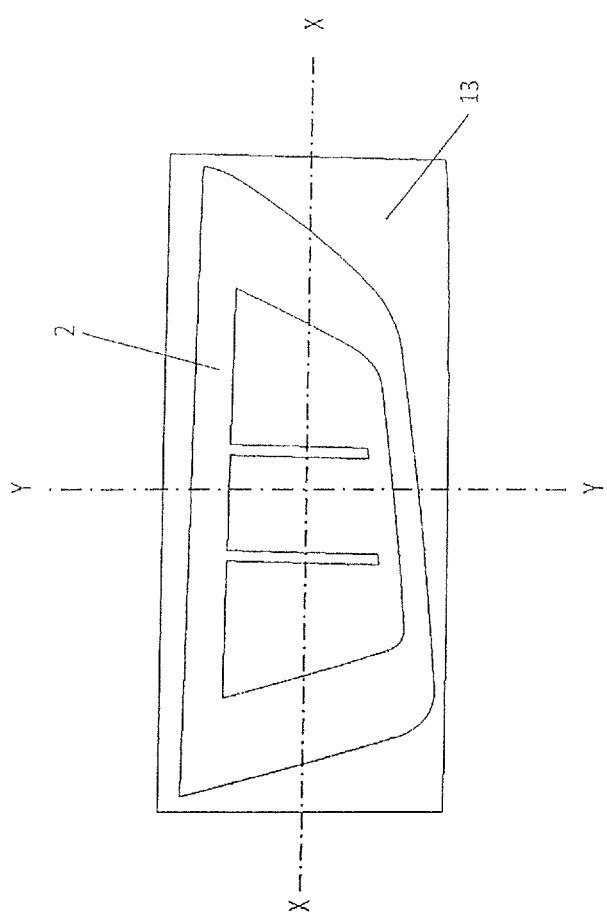
FIG. 11 shows the plan view of a further embodiment of a switching-operation arrangement.
Figure 12:
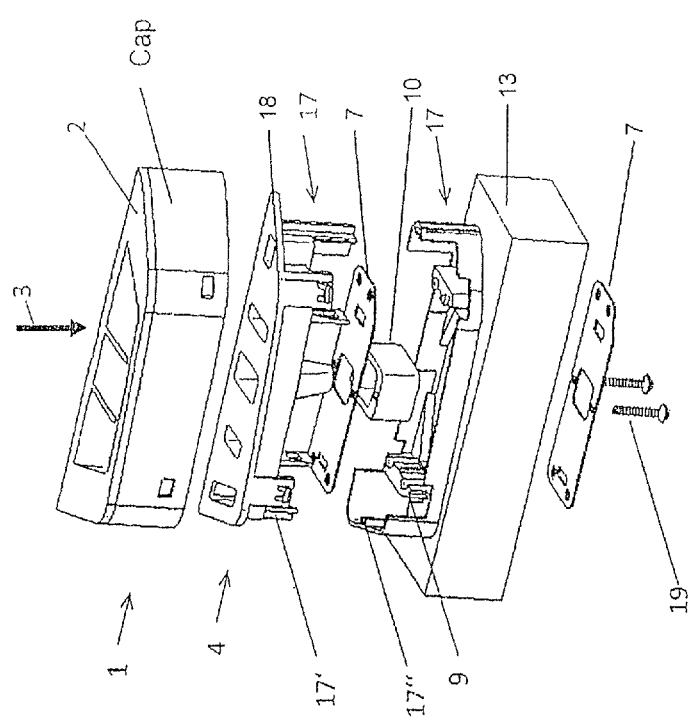
FIG. 12 shows an exploded illustration of the switching-operation arrangement from FIG. 11.
Figure 13:
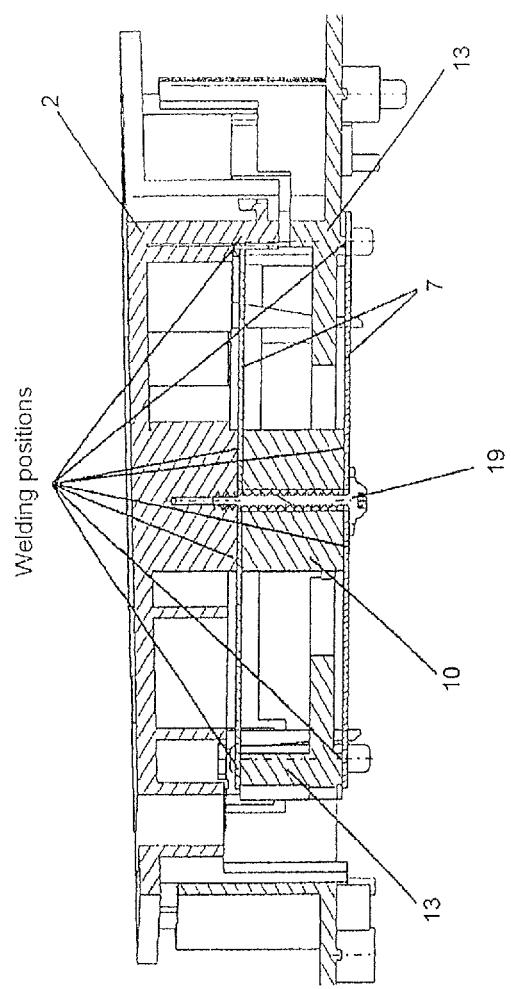
FIG. 13 shows a section through the switching-operation arrangement from FIG. 12.

FIGS. 11 to 13 show yet a further exemplary embodiment of a switching-operation arrangement 1 in the manner of a short-stroke button. Such a switching-operation arrangement 1 can advantageously be used in a motor vehicle. The switching-operation arrangement 1 has a movable actuating surface 2 in the manner of a cap, as can be gathered in more detail from FIG. 12. The actuating surface 2, according to FIG. 11, has an extent along a first axis x and along a second axis y, wherein the two axes x, y are located perpendicularly to one another. The actuating surface 2 interacts with a displacement means 4 such that the actuating surface 2 can be moved essentially linearly, in the direction of a third axis z, by at least one distance from a starting position into an actuating position, wherein the third axis z is located essentially perpendicularly to the first and second axes x, y. The actuating position is in the form of a switching position such that the actuating surface 2, in the switching position, acts with switching action on a switching element, a sensor or the like (not shown specifically) in order to generate a switching signal for switching and/or triggering a function. The displacement means 4 comprises a guide means 17 for guiding the actuating surface 2 along and/or on the first axis x. The displacement means 4 also comprises at least one braced-in elastic element 7 for guiding the actuating surface 2 along and/or on the second axis y. As can be seen with reference to FIG. 11, the extent of the actuating surface 2 along the first axis x is greater than that along the second axis y. Of course, it is also possible, conversely, for the extent of the actuating surface 2 along the first axis x to be smaller than that along the second axis y, but this is not shown specifically. The length and/or the width of the actuating surface 2 along at least one of the first two axes x and/or y are/is, once again, greater than the distance over which guidance is effected by the displacement means 4 to provide for the movement capability of the operating surface 2 in the direction of the third axis z. The movement capability of the actuating surface 2 in the direction of the third axis z here is free of tilting in relation to the first two axes x and/or y.

The elastic element 7 is configured in the form of a sheet-like element of small thickness in the manner of a membrane, such that the elastic element 7 can be deflected elastically essentially perpendicularly to the surface of the elastic element 7. The displacement means 4 comprises an actuator 18, wherein the actuator 18 interacts with a frame 9 and/or a spacer 10. The frame 9 is connected to the spacer 10 by means of the membrane 7, to be precise in the present case by means of two essentially parallel membranes 7, which are arranged on mutually opposite sides of the frame 9 and/or of the spacer 10. The spacer 10, once again, is fastened on the actuator 18, to be precise by means of a screw connection 19.

The guide means 17 comprises a guide rib 17' and a groove 17", which interacts with the guide rib 17'. The one constituent part 17' of the guide means 17 is provided on the actuator 18 and the other constituent part 17" of the guide means 17 is provided on the frame 9. The elastic element 7, once again, comprises a stiff plastic sheet and/or a thin plastic plate, wherein the elastic element 7 is fastened in a braced-in state on the frame 9 and/or on the spacer 10. The fastening may be effected by means of welding, adhesive bonding, riveting or the like, FIG. 13 depicting the welding positions provided.

The actuating surface 2 in the manner of a cap is mounted on the actuator 18. Also provided is a housing 13 for the switching-operation arrangement 1. The actuating surface 2 here is arranged on one side of the housing 13 and can be moved in the direction 3 of the housing 13.

Figure 14:
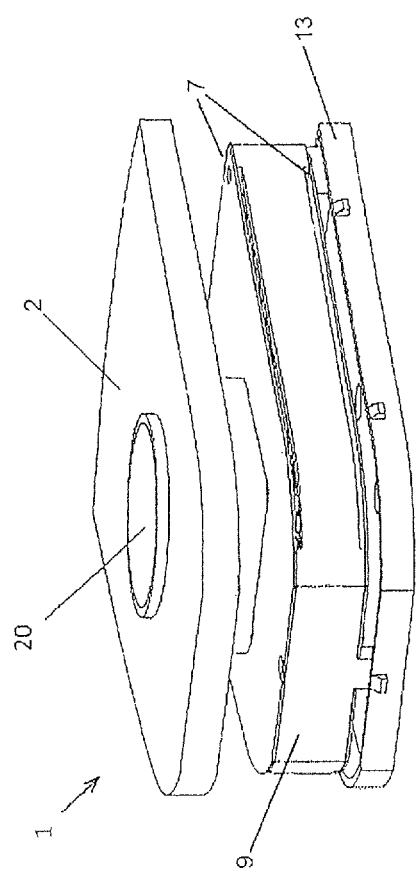
FIG. 14 shows a perspective view of yet another exemplary embodiment of a switching-operation arrangement.
Figure 15:
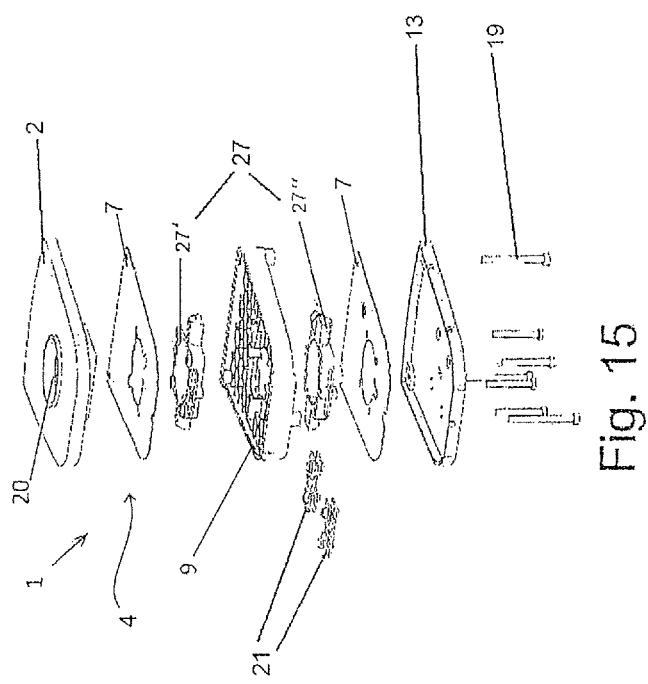
FIG. 15 shows an exploded illustration of the switching-operation arrangement from FIG. 14.

FIGS. 14 to 17 show yet another embodiment for a switching-operation arrangement 1 which has a housing 13 and is used, in particular, in a motor vehicle. The switching-operation arrangement 1 has an actuating surface 2 which is arranged on one side of the housing 13, can be moved in the direction of the housing 13 and, according to FIG. 14, is configured in the manner of an operating plate. As can also be seen with reference to FIG. 15, the actuating surface 2 interacts with a displacement means 4 such that the actuating surface 2 can be moved essentially linearly by at least one distance from a starting position into an actuating position. The actuating position is in the form of a switching position such that the actuating surface 2, in the switching position, acts on a switching element, a sensor or the like (not shown specifically) with switching action in order to generate a switching signal for switching and/or triggering a function.

Figure 16:
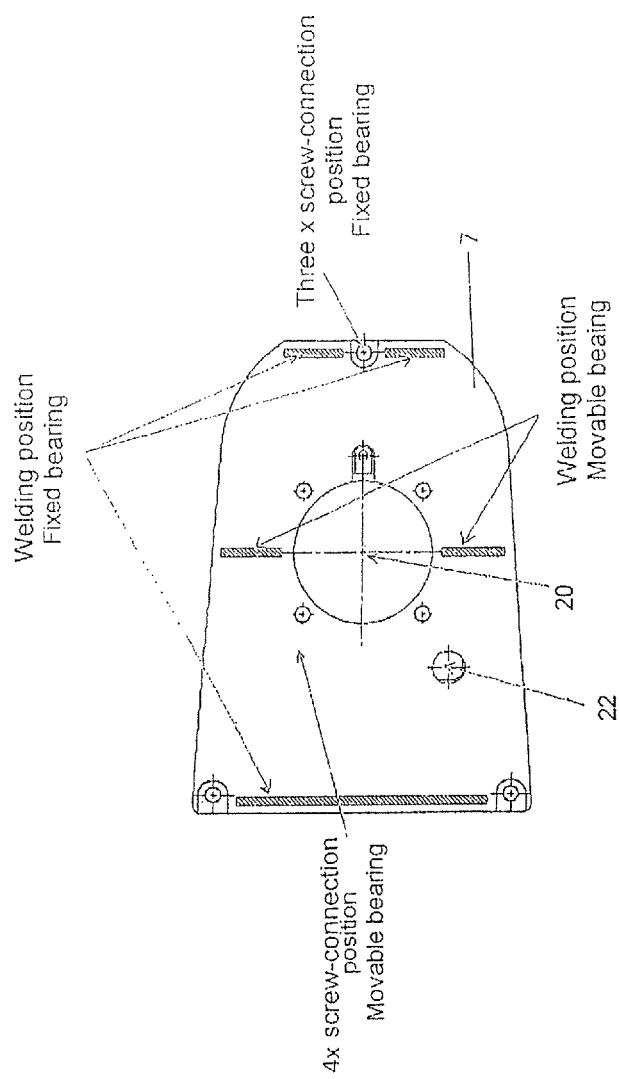
FIG. 16 shows an individual part from FIG. 15.

The actuating surface 2 is configured to be asymmetrical, to be precise approximately double-wedge-shaped, in one direction, as can be seen, for example, with reference to FIG. 16. The actuating surface 2 here has a maximum length in a first direction (x) and a maximum width in a second direction (y). Once again, the actuating surface 2 can be moved linearly by a distance, by means of the displacement means 4, in a third direction (z), which is located essentially perpendicularly to the first two directions (x and/or y). Once again here, the maximum length and/or the maximum width of the actuating surface 2 in at least one of the first two directions (x and/or y) are/is greater than the distance provided for the movement capability of the actuating surface 2 in the third direction (z). The displacement means 4 is configured such that the movement capability of the actuating surface 2 in the third direction (z) is free of tilting in relation to the first two directions (x and/or y).

The displacement means 4 has at least one braced-in elastic element 7. The displacement element 4 also comprises a frame 9 and a guide element 27. At least part of the displacement means 4 is arranged eccentrically in at least one direction in relation to the actuating surface 2, to be precise this part being the guide element 27, as can be seen with reference to FIG. 15. The elastic element 7 is, once again, configured in the form of a sheet-like element of small thickness in the manner of a membrane, such that the elastic element 7 can be deflected elastically essentially perpendicularly to the surface of the elastic element 7. The frame 9 is connected to the guide element 27 by means of the elastic element 7, to be precise in the present case by means of two essentially parallel elastic elements 7, which are arranged on mutually opposite sides of the frame 9 and/or of the guide element 10. The elastic element 7 also comprises a stiff plastic sheet and/or a thin plastic plate, wherein the elastic element 7 is fastened in a braced-in state on the frame 9 and/or on the guide element 10. The fastening may be effected by means of welding, adhesive bonding, riveting or the like, FIG. 16 illustrating the welding positions for the membrane 7 in more detail.

As can also be seen with reference to FIG. 17, the guide element 27 is positioned approximately centrally in the frame 9, as seen in the one direction. However, in the other direction, which is located approximately perpendicularly to the one direction, the guide element 27 is positioned eccentrically in the frame 9. According to FIG. 14, a through-passage 20 is located eccentrically in the actuating surface 2. A circular through-passage 20 is arranged in a corresponding manner in the interior of the guide element 27 and/or in a corresponding manner in the elastic element 7, as can be seen with reference to FIGS. 16 and 17. The guide element 27 comprises two parts 27', 27", wherein damping elements 21 are arranged between the parts 27', 27" of the guide element 27 and/or the frame 9, as can also be seen in FIG. 17. The damping elements 21 damp hard end stopping of the actuating surface 2 during the actuating and/or return operation of the same. The actuating surface 2 is fastened on the guide element 27 by means of a screw connection 19.

Finally, a haptic element interacts with the actuating surface 2 in order to restore the actuating surface 2 and/or to produce a haptic means for moving the actuating surface 2. Interaction with the actuating surface 2 can take place here, in particular, via the guide element 27. The haptic element is arranged eccentrically in relation to the actuating surface 2, in the region of the guide element 27. FIG. 16 depicts the eccentric position 22 for the haptic element.

The invention is not restricted to the exemplary embodiments described and illustrated. Rather, it also covers all specialist developments within the framework of the invention defined by the patent claims. It is thus possible for the switching-operation arrangement 1 according to the invention to be used not just as a touch pad for motor vehicles, but also for other switching elements with large-area operating surfaces and with linear actuation and possibly with short strokes. Furthermore, it is also possible for the switching-operation arrangement 1 to be used in domestic appliances, audio equipment, video equipment, telecommunications equipment or the like.

LIST OF DESIGNATIONS

1: Switching-operation arrangement
2: Actuating surface/Operating surface
3: Directional arrow
4: Displacement means
5: Finger
6: Hand
7: Elastic element/Membrane
8: Peripheral region (of housing)
8': Gap (along peripheral region)
9: Frame
10: Spacer
11: Passive/active element
12: Screw 13: Housing
14: Surface
15: Plug connection
16: Groove-and-tongue guide
17: Guide means
17': Guide rib
17": Groove
18: Actuator
19: Screw connection
20: Through-passage
21: Damping element
22: Positioning (for haptic element)
23: Mount
24: Attachment
25: Aperture
26: Protuberance
27: Guide element
27', 27": Parts of guide element
28: Base plate of 13

The invention claimed is:

1. A switching-operation arrangement for a motor vehicle, comprising: a movable actuating surface; a displacement means; and one of a switching element and a sensor, wherein the actuating surface has an extent along a first axis (x) and a second axis (y), which are located perpendicularly to one another, wherein the actuating surface interacts with the displacement means such that the actuating surface can be moved linearly, in the direction of a third axis (z), by at least one distance from a starting position into an actuating position, wherein the third axis (z) is located perpendicularly to the first and second axes (x, y), and wherein the actuating position is in the form of a switching position such that the actuating surface, in the switching position, acts with switching action on the one of the switching element and the sensor, wherein the displacement means comprises a guide means for guiding the actuating surface at least one of along and on the first axis (x), and at least one braced-in elastic element for guiding the actuating surface at least one of along and on the second axis (y).

2. The switching-operation arrangement according to claim 1, wherein one of a length and a width of the actuating surface along at least one of the first two axes (x and/or y) is greater than a distance over which guidance is effected by the displacement means to provide for the movement capability of the actuating surface in the direction of the third axis (z).

3. The switching-operation arrangement according to claim 1, wherein the elastic element is configured to have a surface and a thickness, such that the elastic element can be elastically deflected perpendicularly to the surface of the elastic element.

4. The switching-operation arrangement according to claim 1, wherein the displacement means further comprises an actuator, the actuator interacts with at least one of a frame and a spacer, the elastic element is braced on at least one of the frame and the spacer, and the frame is connected to the spacer by means of the elastic element.

5. The switching-operation arrangement according to claim 4, wherein the spacer is fastened on the actuator by means of a screw connection.

6. The switching-operation arrangement according to claim 1, wherein the guide means comprises a guide rib and a groove, which interacts with the guide rib, and one of the guide rib and the groove of the guide means is provided on the actuator and the other of the guide rib and the groove of the guide means is provided on the frame.

7. The switching-operation arrangement according to claim 1, wherein the elastic element comprises one of a stiff plastic sheet and a thin plastic plate.

8. The switching-operation arrangement according to claim 1, wherein the one of the switching element and the sensor generates a signal on account of the switching action of the actuating surface in the switching position, and the signal serves for at least one of switching and triggering a function of a switching signal.

9. The switching-operation arrangement according to claim 1, wherein a housing is provided, and the actuating surface is arranged on one side of the housing and can be moved in the direction of the housing.

10. The switching-operation arrangement according to claim 1, wherein the switching-operation arrangement is a short-stroke button.

11. The switching-operation arrangement according to claim 3, wherein the thickness of the elastic element is smaller than an extent of the elastic element.

12. The switching-operation arrangement according to claim 4, wherein the elastic element comprises two parallel elastic elements, which are arranged on mutually opposite sides of at least one of the frame and the spacer.

13. The switching-operation arrangement according to claim 1, wherein the extent of the actuating surface along the first axis (x) is one of smaller and greater than the extent of the actuating surface along the second axis (y).

14. The switching-operation arrangement according to claim 2, wherein the movement capability of the actuating surface in the direction of the third axis (z) is free of tilting in relation to the first two axes (x and/or y).

15. The switching-operation arrangement according to claim 5, wherein the actuating surface is arranged on the actuator, and the actuating surface is mounted as a cap on the actuator.

16. The switching-operation arrangement according to claim 7, wherein the elastic element is fastened in a braced-in state on at least one of the frame and the spacer, and fastening of the elastic element is effected by means of at least one of welding, adhesive bonding, riveting, screw connection, heat staking/hot stamping, and clamping.

* * * * *